(12) United States Patent
Sumesaglam

(10) Patent No.: US 9,490,823 B2
(45) Date of Patent: Nov. 8, 2016

(54) SELF-BIASED OSCILLATOR

(75) Inventor: Taner Sumesaglam, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,487

(22) PCT Filed: Mar. 19, 2012

(86) PCT No.: PCT/US2012/029647
§ 371 (c)(1),
(2), (4) Date: Jun. 18, 2013

(87) PCT Pub. No.: WO2013/141837
PCT Pub. Date: Sep. 26, 2013

(65) Prior Publication Data
US 2013/0271227 A1 Oct. 17, 2013

(51) Int. Cl.
*H03K 3/03* (2006.01)
*H03L 1/00* (2006.01)
*H03L 7/099* (2006.01)
*H03L 7/087* (2006.01)

(52) U.S. Cl.
CPC ............... *H03L 7/087* (2013.01); *H03K 3/03* (2013.01); *H03K 3/0315* (2013.01); *H03L 1/00* (2013.01); *H03L 7/0995* (2013.01)

(58) Field of Classification Search
CPC .. H03K 3/0315; H03K 3/0322; H03K 3/354; H03L 1/00; H03L 7/0995
USPC ..................................... 331/45, 57, 185, 186
See application file for complete search history.

(56) References Cited

U.S. PATENT DOCUMENTS

| | | | | |
|---|---|---|---|---|
| 3,800,241 A | * | 3/1974 | Ochs | 331/45 |
| 4,547,749 A | * | 10/1985 | Kuo | 331/57 |
| 5,635,879 A | * | 6/1997 | Sutardja et al. | 331/57 |
| 5,673,005 A | * | 9/1997 | Pricer | 331/1 R |
| 5,955,929 A | * | 9/1999 | Moon et al. | 331/57 |
| 6,304,148 B1 | * | 10/2001 | Nomura et al. | 331/57 |
| 6,535,071 B2 | * | 3/2003 | Forbes | 331/57 |
| 6,717,478 B1 | * | 4/2004 | Kim et al. | 331/57 |
| 6,765,448 B2 | | 7/2004 | Wu et al. | |

(Continued)

FOREIGN PATENT DOCUMENTS

| | | |
|---|---|---|
| CN | 102281061 | 1/2004 |
| EP | 2081291 | 7/2009 |

(Continued)

OTHER PUBLICATIONS

El Mourabit et al., "CMOS Ring Oscillators with Enhanced Frequency Operation", 2010 International Conference of Microelectronics, IEEE, Dec. 2010, pp. 192-195.*
International Search Report and Written Opinion issued for International Patent Application No. PCT/US2012/029647, mailed Nov. 30, 2012, 14 pages.

(Continued)

*Primary Examiner* — Levi Gannon
(74) *Attorney, Agent, or Firm* — Blakely, Sokoloff, Taylor & Zafman LLP

(57) ABSTRACT

Described herein is a self-biased oscillator. The self-biased oscillator comprises a first differentiator with adjustable resistance or capacitance, the first differentiator having an output node and an input node; and a second differentiator with adjustable resistance or capacitance, the second differentiator having an input node coupled to the output node of the first differentiator, and having an output node coupled to the input node of the first differentiator.

10 Claims, 6 Drawing Sheets

(56) References Cited

U.S. PATENT DOCUMENTS

| | | | |
|---|---|---|---|
| 7,633,351 B2* | 12/2009 | Raita et al. | 331/176 |
| 7,961,057 B2 | 6/2011 | Ong et al. | |
| 8,031,011 B2* | 10/2011 | Moussavi et al. | 331/57 |
| 8,130,048 B2* | 3/2012 | Kobayashi | 331/57 |
| 8,339,208 B2* | 12/2012 | Luong et al. | 331/117 FE |
| 8,791,764 B2* | 7/2014 | Shin et al. | 331/57 |
| 2008/0036512 A1* | 2/2008 | Yamamoto et al. | 327/155 |

FOREIGN PATENT DOCUMENTS

| WO | 2004027979 | 1/2004 |
|---|---|---|
| WO | WO 2004/027979 | 4/2004 |
| WO | WO-2004/027979 | 4/2004 |

OTHER PUBLICATIONS

PCT/US2012/029647 Notification Concerning Transmittal of International Preliminary Report on Patentability, mailed Oct. 2, 2014, 11 pages.
PCT International Search Report for PCT Counterpart Application No. PCT/US2012/029647, 3 pgs., (Nov. 30, 2012).
PCT Written Opinion of the International Searching Authority for PCT Counterpart Application No. PCT/US2012/029647, 9 pgs., (Nov. 30, 2012).
Office Action for counterpart Chinese Application No. 201280071591.0, 12 pages, mailed Apr. 21, 2016.
El Mourabit, Aimad., et al., "CMOS Ring Oscillators with Enhanced Frequency Operation," 22nd International Conference on Microelectronics, pp. 192-195, 2010.

* cited by examiner

SELF-BIASED OSCILLATOR

CLAIM OF PRIORITY

This application claims the benefit of priority of International Patent Application No. PCT/US2012/029647 filed Mar. 19, 2012, titled "SELF-BIASED OSCILLATOR," which is incorporated by reference in its entirety.

BACKGROUND

Traditional voltage controlled oscillator (VCO) exhibits an oscillating frequency that depends on the power supply level provided to the VCO. As the power supply level increases, the oscillating frequency increases because the delay elements forming the VCO become faster. Likewise, when the power supply level decreases, the oscillating frequency decreases. Such traditional VCO exhibit power supply noise sensitivity that may result in noise/jitter in the output of the VCO.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
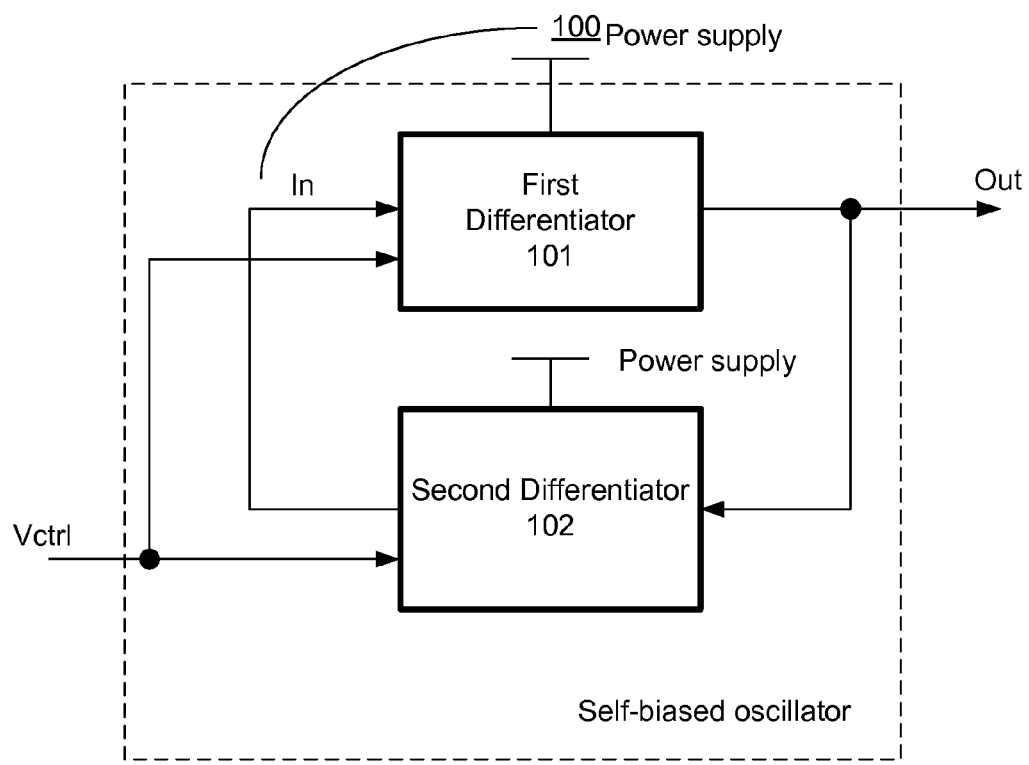
FIG. 1 is a high level circuit of a self-biased oscillator, according to one embodiment of the disclosure.

Traditional voltage controlled oscillators (VCOs) such as an inverter based ring oscillator, a pseudo-differential inverter ring, a self-biased current-mode-logic (CML) ring, etc, exhibit high sensitivity to power supply noise. High sensitivity to power supply noise translates to jitter and noise in the oscillating signal generated by the VCO. To compensate for the high sensitivity of power supply noise, traditional oscillators are made larger in size (W/L) resulting in higher power dissipation and area.

Ring oscillator topologies often used in phase locked loops (PLLs) due to their large frequency tuning range, however, have poor performance (as defined by power supply rejection ratio) when it comes to noise rejection. Self-biased differential ring oscillators have better noise rejection than inverter based traditional ring oscillators yet at a considerable power/area cost. Poor performance of these ring oscillators is because the oscillation frequency ($f_o$) of these oscillators is a direct function of their power supply (Vcc). The oscillation frequency ($f_o$) of such traditional oscillators can be expressed as:

$$f_0 \cong \frac{I}{N \cdot C \cdot V_{cc}}$$

where, 'N' is the number of delay stages of the oscillator, and where 'I' is the current through output capacitance 'C' of the oscillator. The above equation shows that $f_o$ is inversely proportional to the power supply Vcc. Any noise on the power supply Vcc may translate to jitter and noise on the oscillating signal with frequency $f_o$.

The self-biased oscillator discussed herein provides better power supply rejection than traditional VCOs because the oscillating frequency of the output of the self-biased oscillator is not a function (or not a strong function) of power supply or gain of the delay element or amplifier of the self-biased oscillator. In one embodiment, the self-biased oscillator is self-biased by its feedback resistor. The self-biased oscillator discussed herein consumes far less power than a pseudo-differential inverter ring oscillator or a self-biased CML ring oscillator, and consumes much less area than traditional oscillators. The self-biased oscillator can be used in any oscillator usage model including analog phase locked loops and digital phase locked loops. The self-biased oscillator discussed herein comprises an inverter, variable resistance and/or capacitance, which makes the design simple and highly scalable over process technologies. Other technical effects are contemplated by the embodiments discussed herein.

The term "scaling" herein refers generally to transferring the circuit design and layout from one process technology to another process technology.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

FIG. 1 is a high level circuit of a self-biased oscillator 100, according to one embodiment of the disclosure. In one embodiment, the self-biased oscillator 100 comprises a first differentiator 101 coupled to a second differentiator 102 forming an oscillator. The first differentiator 101 and the second differentiator 102 are circuits providing outputs which are proportional to the time derivative of the input.

In this embodiment, the output node Out of the first differentiator 101 is coupled to the input of the second differentiator 102, and the output node of the second differentiator 102 is coupled to the input node of the first differentiator. In one embodiment, both the first differentiator 101 and second differentiator 102 are powered by the power supply. The noise of the power supply has little or no effect on the oscillating frequency of the oscillator 100.

In one embodiment, the gain or transfer function of the first differentiator is the same as the gain or transfer function of the second differentiator. In another embodiment, the gain or transfer function of the first differentiator is different from the gain or transfer function of the second differentiator.

The circuit 100 discussed herein results in a signal on the output node Out to have an oscillating frequency. In one embodiment, a control signal Vctrl is input to both the first and second differentiators 101 and 102, respectively, to adjust the oscillation frequency of the signal on the output node Out. In one embodiment, the control signal Vctrl is an analog signal to control a resistance and/or capacitance of a transistor. In another embodiment, the control signal Vctrl is a digital bus to turn on/off a number of transistors in the first and second differentiators 101 and 102, respectively, to change the resistance and/or capacitance of the first and second differentiators 101 and 102, respectively.

Figure 2:
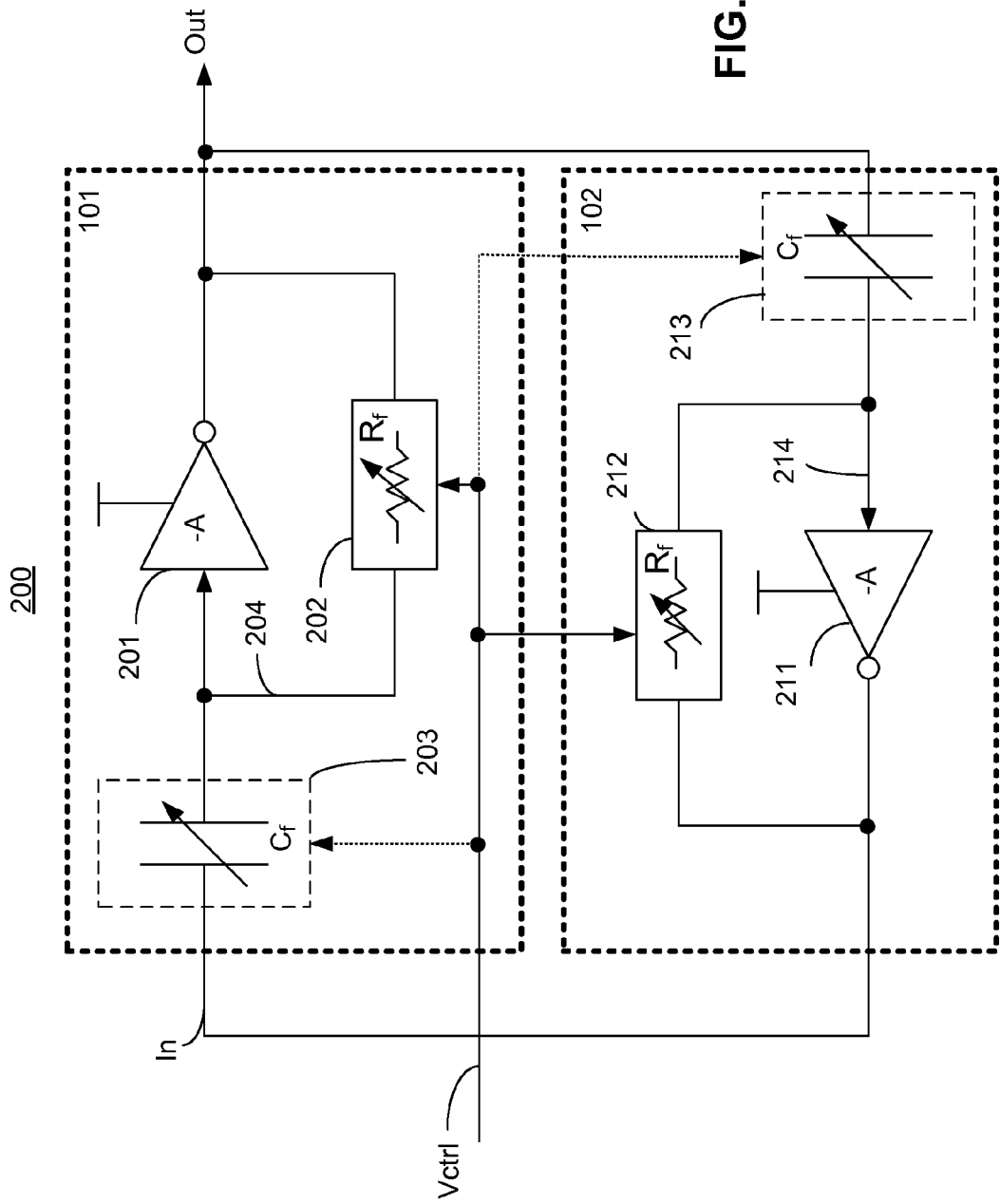
FIG. 2 is a self-biased oscillator, according to one embodiment of the disclosure.

FIG. 2 is a self-biased oscillator 200, according to one embodiment of the disclosure. In one embodiment, each of the first and second differentiators 101 and 102, respectively, comprise: amplifiers 201 and 211, resistive devices 202 and 212, and capacitive devices 203 and 213, coupled together as shown. In one embodiment, the resistive devices 202 and 212 having resistance $R_f$ are coupled between the output node of the amplifiers 201 and 211 and input nodes of the amplifiers 201 and 211. In one embodiment, the resistance $R_f$ of the resistive devices 202 and 212 is adjustable by means of the control signal Vctrl.

For example, a transistor is used for providing the effective resistance $R_f$, where the control signal couples to the gate of the transistor and controls the resistance of the transistor. In another embodiment, a transistor is coupled to a passive resistor or active resistor (e.g., always on transistor) for providing the resistance $R_f$, where the control signal couples to the gate of the transistor and controls the resistance of the transistor and thus the combined resistance $R_f$ (combined resistance of the passive or active resistor and the transistor). In another example, the control signal is a digital bus to turn on/off any number of transistors coupled together in parallel to one another to provide resistance $R_f$. In one embodiment, only the transistor(s) provides the effective resistance $R_f$ i.e., there is no passive resistor coupled to the transistor(s).

In one embodiment, the amplifiers 201 and 211 have a gain of −A (where A=Vo/Vin). In one embodiment, the amplifiers 201 and 211 are inverters having a p-type device coupled in series to an n-type device. In another embodiment, the amplifiers 201 and 211 are operational amplifiers (OPAMPs). In other embodiments, other forms of amplifiers may be used.

In one embodiment, the capacitive devices 203 and 213, having respective first and second terminals, with their respective first terminals coupled to the inputs 204 and 214 of the amplifiers 201 and 211. The second terminals of the capacitive devices 203 and 213 form the inputs of the respective first and second differentiators 101 and 102. In this embodiment, the second terminal of the capacitive device 213 (of the second differentiator 102) is coupled the output node Out of the first differentiator 101. In this embodiment, the second terminal of the capacitive device 203 is coupled to the output terminal In (also input terminal of the first differentiator 101) of the second differentiator 102.

In the embodiments discussed herein, the capacitive devices 203 and 213 have a capacitance of $C_f$. In one embodiment, the capacitive devices 203 and 213 are passive devices. In other embodiments, the capacitive devices 203 and 213 are formed from active devices such as transistors operating in capacitive modes. In other embodiments, the capacitive devices 203 and 213 are implemented as varactors of any known design. In one embodiment, the capacitive devices 203 and 213 are implemented by interleaving layers of metal layers, also called metal capacitors. In other embodiments, the capacitive devices 203 and 213 are implemented by interleaving layers of metal layers and active transistors operable in capacitive mode. In one embodiment, the capacitive devices 203 and 213 have variable capacitance controlled by the control signal Vctrl or another control signal (not shown), different from the control voltage for adjusting $R_f$, for the capacitive devices 203 and 213 only.

In one embodiment, both resistive devices 202 and 212 and the capacitive devices 203 and 213 have corresponding variable resistances and capacitances controllable by control signals such as (and including) Vctrl. In another embodiment, only the resistive devices 202 and 212 have variable resistances controllable by control signals such as (and including) Vctrl while the capacitance of the capacitive devices 203 and 213 have fixed capacitances. In another embodiment, only the capacitive devices 203 and 213 have variable capacitances controllable by control signals such as (and including) Vctrl while the resistances of the resistive devices (202 and 212) have fixed resistances.

The following small signal analysis of the first 101 and/or second 102 differentiators comprising inverters as amplifiers 201 and 211 illustrate that an oscillator formed from the first 101 and second 102 differentiators coupled together as shown in FIG. 1 and FIG. 2 generate an output signal (on output node Out) with oscillating frequency which is not a function of power supply or gain or the amplifiers 201 and 211.

The transfer function in s-domain of the first 101 and/or second 102 differentiators can be expressed as:

$$H(s) = \frac{V_o}{V_i} = \frac{-sA}{s + A/R_f C_f}$$

where 'A' is the gain of the inverter 201 or 211 expressed as the ratio of sum of trans-conductance of the p-type and n-type transistors of the inverter i.e., $(g_{mn}+g_{mp})/(g_{op}+g_{on})$, where $V_o$ is the output voltage at the node Out and $V_i$ is the input voltage at node In, where $R_f$ is the effective resistance of the feedback resistor 202/212, and where $C_f$ is the effective capacitance of capacitive device 203/213.

According to Bark-Hausen criteria for oscillation, the following is satisfied:

1+H(s)*H(s)=0

Solving the above equation leads to:

$$s^2 + s\frac{2A}{(A^2+1)R_f C_f} + \frac{A^2}{(A^2+1)(R_f C_f)^2} = 0$$

Assuming $A^2 \gg 1$, the solution to the above equation yields two right-half plane pole pairs give as:

$$s_{1,2} = \frac{-1}{R_f C_f}\left(\frac{1}{A} \pm j\right)$$

This shows that the oscillation will start and then the pole pair will move to the line between right and left half planes so the oscillation is sustained. The frequency of oscillation of the self-biased oscillator 100/200 is given as:

$$f_o = \frac{1}{2\pi \cdot R_f C_f}$$

The analysis herein illustrates that the frequency of oscillation of the self-biased oscillator 100/200 depends on the resistance $R_f$ and capacitance $C_f$ of the corresponding feedback resistor 202/212 and capacitive device 203/213 of the first 101 and/or second 102 differentiators.

The analysis herein shows a fundamental difference between traditional ring oscillators which have oscillating frequencies that depend on power supply voltage (Vcc), and therefore, the traditional ring-oscillators are more vulnerable to jitter from power supply noise.

Figure 3:
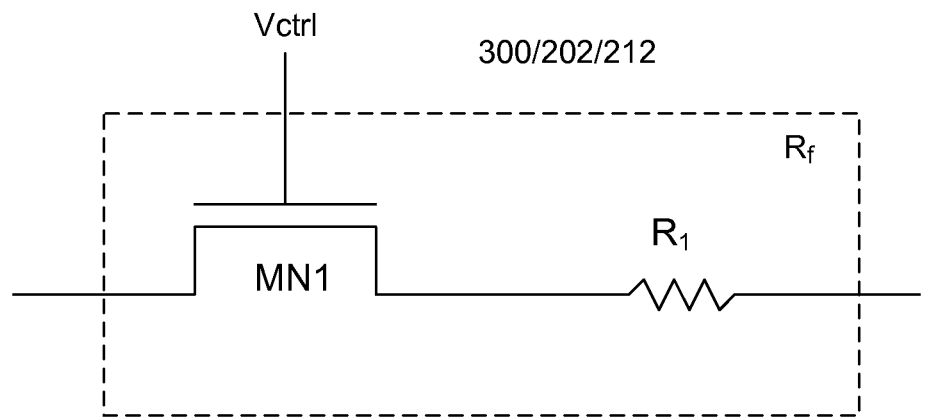
FIG. 3 is a voltage controlled resistive device of the self-biased oscillator, according to one embodiment of the disclosure.

FIG. 3 is a voltage controlled resistive device 300/202/212 of the self-biased oscillator 100/200, according to one embodiment of the disclosure. The embodiment of FIG. 3 is described with reference to FIGS. 1-2. In this embodiment, the resistive device 300/202/212 comprises a transistor with its gate terminal coupled to a control signal Vctrl. While the embodiments herein discuss an n-type transistor MN1, any transistor capable of providing adjustable resistance in response to changing voltage levels of the control signal Vctrl may be used.

For example, in one embodiment, the transistor is a p-type transistor. In another embodiment, the transistor is a combination of a p-type and n-type transistor (e.g., a transmission pass gate). While the embodiment herein shows a single transistor MN1, multiple transistors in series or parallel with one another may be used and controlled by the control signal Vctrl to provide an adjustable resistance.

In one embodiment, the transistor with adjustable resistance is coupled in series with another resistive device $R_1$ to provide the effective resistance $R_f$. In one embodiment, the resistive device $R_1$ has a fixed resistance. In another embodiment, the resistive device $R_1$ is implemented using a passive resistor e.g., a poly resistor, or discrete resistor. In other embodiments, other implementations of the resistive device $R_1$ may be used. For example, the resistive device $R_1$ is a transistor which is always on. In one embodiment, the resistive device $R_1$ is not used and the effective resistance $R_f$ is provided by the transistor MN1.

Figure 4:
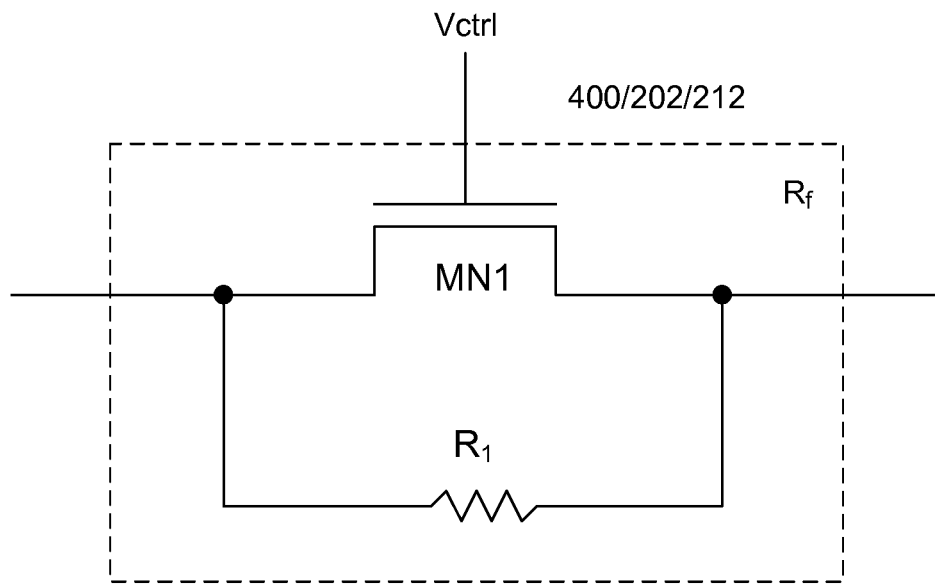
FIG. 4 is a voltage controlled resistive device of the self-biased oscillator, according to another embodiment of the disclosure.

FIG. 4 is a voltage controlled resistive device 400/202/212 of the self-biased oscillator 100/200, according to another embodiment of the disclosure. FIG. 4 is described with reference to FIGS. 1-2. In this embodiment, a transistor to provide adjustable resistance is coupled in parallel to the resistive device $R_1$ to provide the effective resistance $R_f$. In one embodiment, the resistive device $R_1$ is not used and the effective resistance $R_f$ is provided by the parallel transistors.

While the embodiments herein describes an n-type transistor MN1, any transistor capable of providing adjustable resistance in response to changing voltage levels of the control signal Vctrl may be used.

For example, in one embodiment, the transistor is a p-type transistor. In another embodiment, the transistor is a combination of a p-type and n-type transistor (e.g., a transmission pass gate). While the embodiment herein shows a single transistor MN1, multiple transistors in series or parallel with one another may be used and controlled by the control signal Vctrl to provide an adjustable resistance.

In one embodiment, the resistive device $R_1$ has a fixed resistance. In another embodiment, the resistive device $R_1$ is implemented using a passive resistor e.g., a poly resistor, or discrete resistor. In other embodiments, other implementations of the resistive device $R_1$ may be used. For example, the resistive device $R_1$ is a transistor which is always on.

Figure 5:
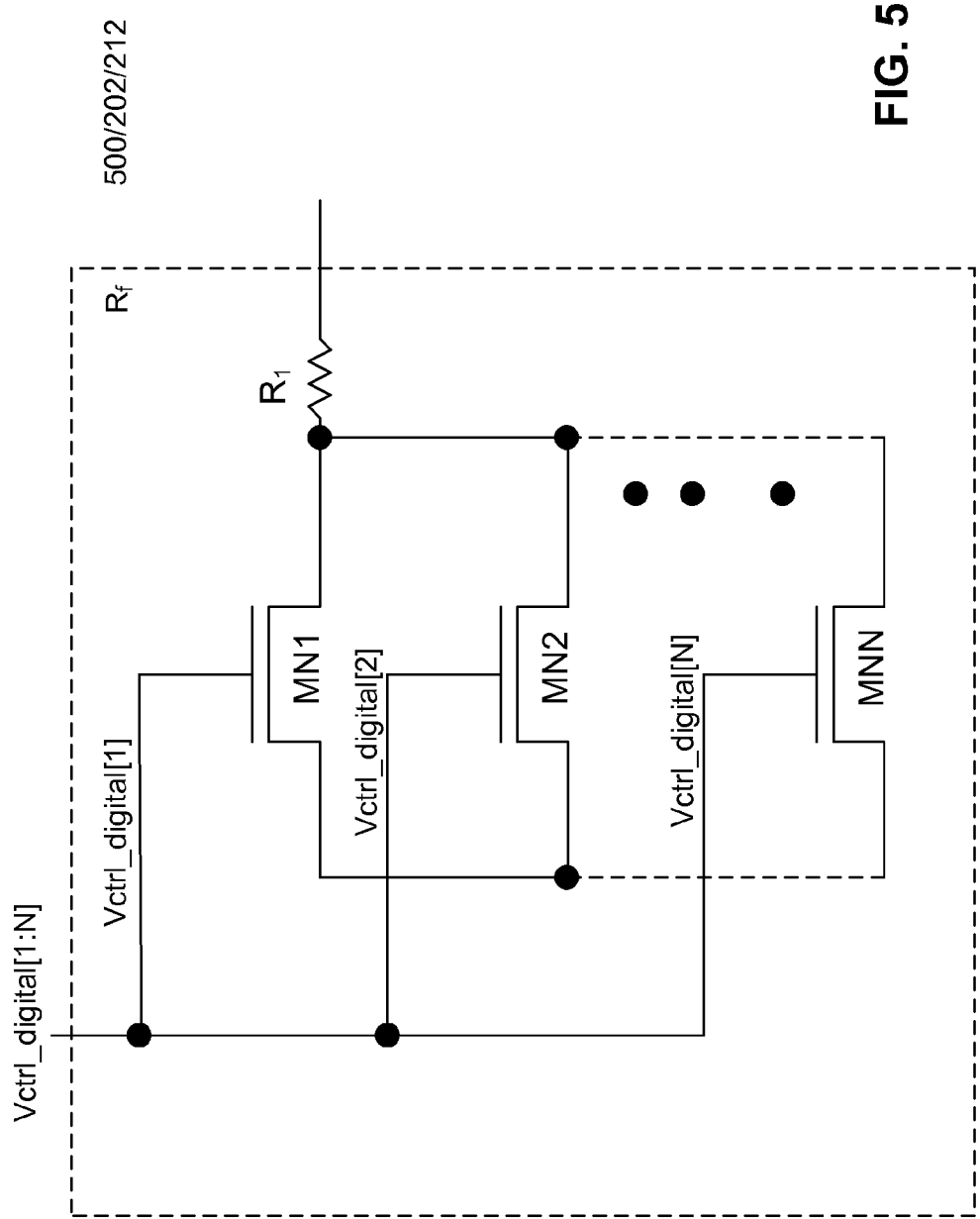
FIG. 5 is a digitally controlled resistive device of the self-biased oscillator, according to one embodiment of the disclosure.

FIG. 5 is a digitally controlled resistive device 500/202/212 of the self-biased oscillator 100/200, according to one embodiment of the disclosure. FIG. 5 is described with reference to FIGS. 1-2. In this embodiment, a number of digitally controlled transistors are coupled together to provide adjustable resistance, and are coupled to the resistive device $R_1$ to provide the effective resistance $R_f$. In one embodiment, the resistive device $R_1$ is not used and the digitally controlled transistors provide the effective resistance $R_f$.

In this embodiment, the control signal Vctrl is a digital bus Vctrl_digital[1:N] of 'N' bits, where 'N' is an integer greater or equal to 1. In one embodiment, each bit of the digital bus Vctrl_digital[1:N] is coupled to a gate terminal of a transistor which is operable to turn on or off according to the signal level of the coupled bit signal.

While the embodiment herein describes n-type transistors MN1 in parallel, any transistor capable of providing adjustable resistance in response to changing voltage levels of the control signal Vctrl may be used. For example, in one embodiment, the transistors are p-type transistors. In another embodiment, the transistors are a combination of a p-type and n-type transistors (e.g., a transmission pass gates). While the embodiment herein shows transistors MN1-N in series with resistive device $R_1$, the transistors MN1-N may be in parallel to the resistive device $R_1$.

In one embodiment, the resistive device $R_1$ has a fixed resistance. In another embodiment, the resistive device $R_1$ is implemented using a passive resistor e.g., a poly resistor, or discrete resistor. In other embodiments, other implementations of the resistive device $R_1$ may be used. For example, the resistive device $R_1$ is a transistor which is always on.

Figure 6:
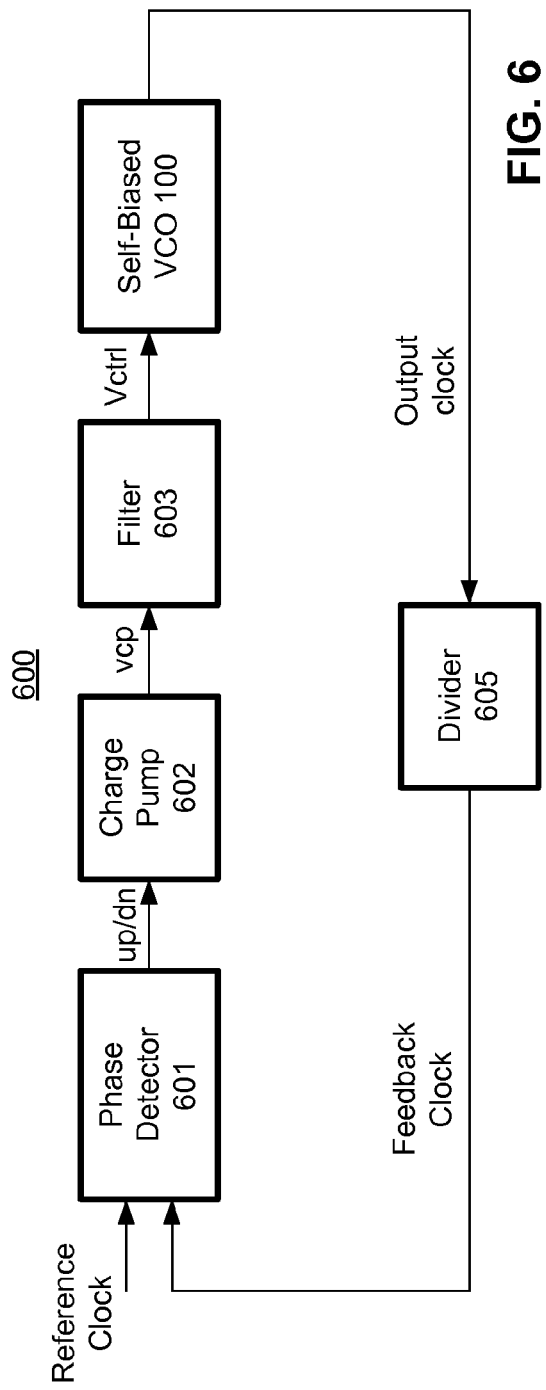
FIG. 6 is a phase locked loop (PLL) with the self-biased oscillator, according to one embodiment of the disclosure.

FIG. 6 is a phase locked loop (PLL) 600 with the self-biased oscillator 100/200, according to one embodiment of the disclosure. In one embodiment, the PLL 600 comprises a phase detector 601, a charge pump 602, a filter 603, an oscillator 100, and a divider 605. So as not to obscure the embodiments of the disclosure, a simplified PLL 600 is illustrated with details not shown.

In this embodiment, the self-biased oscillator 100/200 is used as a voltage controlled oscillator for the PLL 600, wherein the self-biased oscillator 100/200 provides voltage adjustable output clock signal with little or no sensitivity to power supply noise on the power supply of the self-biased oscillator 100/200. In one embodiment, the phase detector 601 compares a reference clock signal with a feedback clock signal generated by dividing the output clock signal by a divider 605. In one embodiment, the output of the phase detector 601 is an up/dn signal indicating whether the phase of the feedback clock signal is ahead or behind the relative phase of the reference clock signal. Any known phase detector architecture may be used to implement the phase detector 601.

In one embodiment, the output (up/dn signal) of the phase detector 601 is received by the charge pump 602. In one embodiment, the charge pump 602 generates currents or voltages (e.g., vcp) indicating whether the control voltage Vctrl should be raised or lowered relative to its previous value. Any known charge pump may be used herein. In one embodiment, the output of the charge pump vcp is filtered by an analog filter e.g., an RC network to generate the control signal Vctrl to control the resistance and/or capacitance of resistive devices 202/212 and capacitive devices 203/213 of the self-biased oscillator 100/200. In one embodiment, the resistive devices are the devices discussed with reference to FIGS. 3-4.

Figure 7:
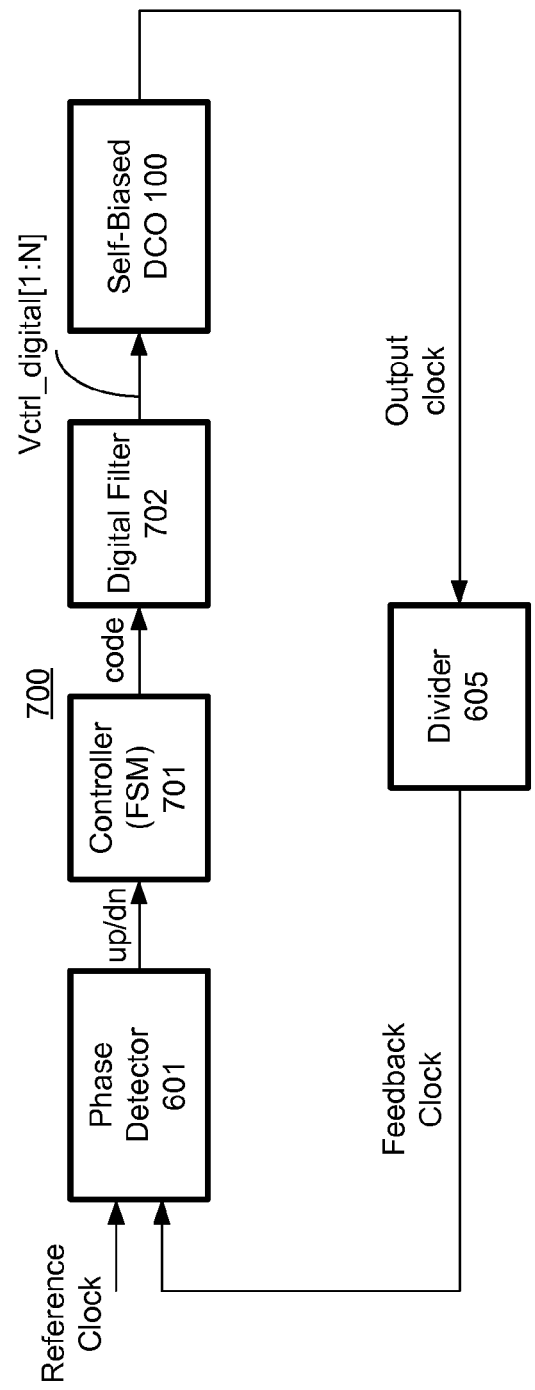
FIG. 7 is a digital phase locked loop (DPLL) with the self-biased oscillator, according to one embodiment of the disclosure.

FIG. 7 is a digital phase locked loop (DPLL) 700 with the self-biased oscillator 100/200, according to one embodiment of the disclosure. In one embodiment, the DPLL 700 comprises a phase detector 601, a controller or finite state machine (FSM) 701, a digital filter 702, a digital self-biased oscillator 100/200, and a divider 605. So as not to obscure the embodiments of the disclosure, a simplified DPLL 700 is illustrated with details not shown. In one embodiment, the digital phase locked loop is an all digital phase locked loop (ADPLL).

In this embodiment, the self-biased oscillator 100/200 is used as a digitally controlled oscillator for the DPLL 700, wherein the self-biased oscillator 100/200 provides voltage adjustable output clock signal with little or no sensitivity to power supply voltage of the self-biased oscillator 100/200. In one embodiment, the phase detector 601 (as discussed with reference to FIG. 6) compares a reference clock signal with a feedback clock signal generated by dividing the output clock signal by a divider 605. In one embodiment, the output of the phase detector 601 is an up/dn signal indicating whether the phase of the feedback clock signal is ahead or behind the relative phase of the reference clock signal.

In one embodiment, the output up/dn signal of the phase detector 601 is received by the controller 701 which generates a digital code(s) indicating the step size and oscillating frequency setting of the self-biased DCO (digitally controlled oscillator) 100/200. In one embodiment, the output code(s) of the controller 701 is received by the digital filter 702 which filters noise in the code(s) and generate a Vctrl_digital[1:N] signal as described with reference to FIG. 5. The output of the DCO 100/200 is then divided by the divider 605 for comparing the feedback signal with the reference clock signal.

The embodiments discussed herein provide several unexpected results, compared to traditional inverter ring oscillator, pseudo-differential inverter ring oscillator, self-biased CML ring oscillator, with reference to oscillator performance parameters.

For example, the embodiments discussed herein provide lower power supply noise rejection, lower peak-to-peak jitter, lower power dissipation, lower Kvcc GHz/V, lower Kvctrl GHz/V, and higher ratio of Kvctrl/Kvcc, where Kvcc is the oscillating frequency gain relative to change in power supply voltage (Vcc), and where Kvctrl is the frequency gain of the oscillator relative to change in control voltage Vctrl.

Table 1 provides a comparison of performance parameters for four different oscillators including the self-biased oscillator 100/200. The three oscillators from the top are traditional oscillators. The performance results are based for a 1V power supply (Vcc) and an oscillator operable to provide an oscillating frequency range of 2-6 GHz.

The parameter I(vcc) indicates the current consumed by the oscillator to provide the same oscillating frequency at the same power supply level. The parameter "PSN" indicates peak-to-peak jitter in picoseconds for the same power supply injected noise. The parameter Kvcc is the oscillating frequency gain relative to change in power supply voltage (Vcc). The parameter Kvctrl is the frequency gain of the oscillator relative to change in control voltage Vctrl. The parameter KVctrl/Kvcc is the power supply sensitive with reference to control sensitivity.

TABLE 1

Comparison of performance parameters

| Oscillator topology | I(vcc) mA | PSN ps | Kvctrl GHz/V | Kvcc GHz/V | Kvctrl/Kvcc |
|---|---|---|---|---|---|
| TRADITIONAL: | | | | | |
| Inverter ring | 0.56 | 65.9 | 22.8 | 21.6 | 1.06 |
| Pseudo-diff inv ring | 1.44 | 48.3 | 16.9 | 16.6 | 1.02 |
| Self-biased CML ring | 13.00 | 38.5 | 16.2 | 6.4 | 2.53 |
| Self-biased oscillator 100/200 | 0.58 | 8.3 | 10.5 | 2.33 | 4.51 |

As shown in Table 1, the self-biased oscillator 100/200 consumes far less power than most of the traditional oscillators. The self-biased oscillator 100/200 exhibits high power supply rejection ratio, and has a higher ratio of Kvctrl/Vcc.

Figure 8:
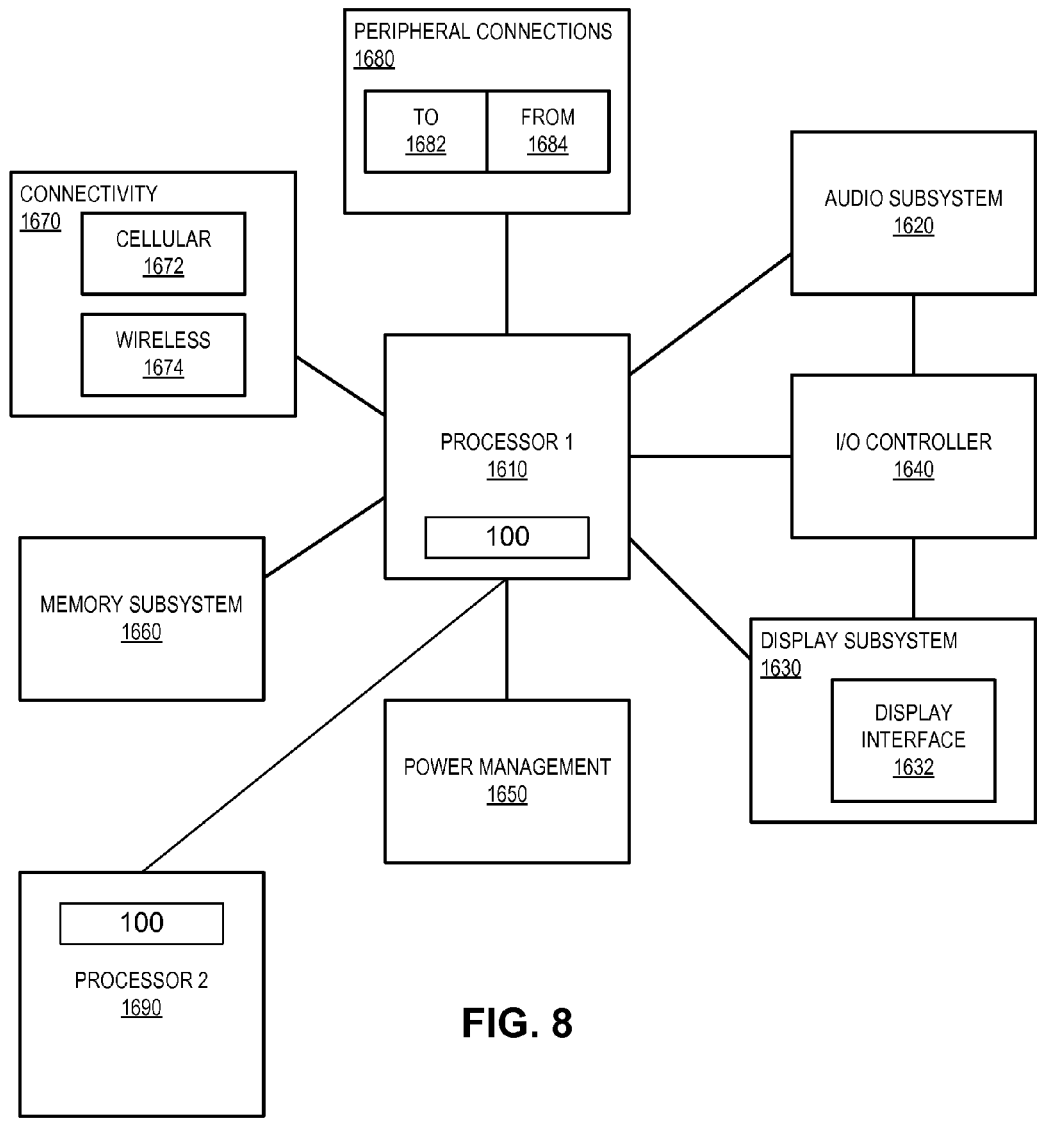
FIG. 8 is a system-level diagram of a smart device comprising a processor with the self-biased oscillator, according to one embodiment of the disclosure.

FIG. 8 is a system-level diagram of a smart device 1600 comprising a processor with the self-biased oscillator 100/200, according to one embodiment of the disclosure. FIG. 8 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the self-biased oscillator 100 and a second processor 1690 with the self-biased oscillator 100, according to the embodiments discussed herein. The self-biased oscillator 100 may be placed in any suitable area to provide an oscillating signal.

The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The self-biased oscillator 100 discussed herein can be used for wireless circuits. In one embodiment, self-biased oscillator 100 is used in blocks 1670, 1680, 1620, 1640, and 1630 to provide oscillating signals which have high power supply noise immunity, low power consumption, and smaller area than traditional oscillators.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the disclosure has been described in conjunction with specific embodiments thereof, many alternatives, modifications and variations of such embodiments will be apparent to those of ordinary skill in the art in light of the foregoing description.

For example, the capacitive devices of the first and second differentiators may be controlled independent of one another. In one embodiment, the capacitive device of the first differentiator is made adjustable while the capacitive device of the second differentiator is fixed. In another embodiment, capacitive device of the second differentiator is made adjustable while the capacitive device of the first differentiator is fixed. In one embodiment, the resistive devices the first and second differentiators may be controlled independent of one another. In one embodiment, the resistive device of the first differentiator is made adjustable while the resistive device of the second differentiator is fixed. In another embodiment, resistive device of the second differentiator is made adjustable while the resistive device of the first differentiator is fixed. In other embodiments, various combinations of fixed and adjustable capacitive and resistive devices for the first and second differentiators may be used to form an oscillator.

The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment the apparatus comprises: a first differentiator with adjustable resistance or capacitance, the first differentiator having an output node and an input node; and a second differentiator with adjustable resistance or capacitance, the second differentiator having an input node coupled to the output node of the first differentiator, and having an output node coupled to the input node of the first differentiator.

In one embodiment, the first and second differentiators comprise: an amplifier with an input node and an output node; and a resistive device with a node coupled to the input node of the amplifier. In one embodiment, the first and second differentiators comprise: a switchable device coupled in series parallel with the resistive device, wherein the switchable device having a node coupled to the output node of the amplifier. In one embodiment, the switchable device has a resistance controllable by a control signal. In one embodiment, the resistive device has a resistance controllable by a control signal. In one embodiment, the amplifier is an inverter or an operational amplifier (OPAMP).

In one embodiment, the first differentiator comprises: a capacitive device with a first node coupled to the input node of the first differentiator, and a second node coupled to an input of an amplifier. In one embodiment, the capacitive device is a varactor with a capacitance controllable by a control signal. In one embodiment, the first node of the capacitive device is coupled to the output node of the second differentiator. In one embodiment, the second differentiator comprises: a capacitive device with a first node coupled to the input node of the second differentiator, and a second node coupled to an input of an amplifier. In one embodiment, the capacitive device is a varactor with a capacitance controllable by a control signal. In one embodiment, the first node of the capacitive device is coupled to the output node of the second differentiator.

In one embodiment, the apparatus further comprises a circuit for generating a control signal to adjust the resistance or capacitance of the first and second differentiators. In one embodiment, the first and second differentiators are coupled together for operating as an oscillator. In one embodiment, the output node of the first differentiator has an output signal with an oscillating frequency which is independent of power supply provided to an amplifier of the first differentiator.

In another example, the apparatus comprises: a first differentiator; and a second differentiator coupled to the first differentiator to form an oscillator having an oscillation frequency independent of the power supply to the first and second differentiators. In one embodiment, the first and second differentiators comprise: an amplifier with an input node and an output node; and a resistive device with a node coupled to the input node of the amplifier. In one embodiment, the first and second differentiators comprise: a switchable device coupled in series or parallel to the resistive device, wherein the switchable device having a node coupled to the output node of the amplifier. In one embodiment, the resistive device has a resistance controllable by a control signal. In one embodiment, the amplifier is an inverter or an operational amplifier (OPAMP).

In another example, a system comprises: a wireless antenna; and a processor operable to communicate with other devices via the wireless antenna, the processor comprising an oscillator according to the apparatus discussed herein. In one embodiment, the system further comprises a display unit.

In another example, a phase or delay locked loop (i.e., circuit) comprises: a phase detector to compare the phases of a reference clock signal and a feedback signal; and an oscillator to generate the feedback signal directly or indirectly, the oscillator according to the apparatus discussed herein.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a first differentiator including a first capacitive device, a first resistance device, and a first amplifier, the first amplifier having an output node and an input node, wherein at least one of the first capacitive device and the first resistance device is adjustable; and
   a second differentiator including a second capacitive device, a second resistance device, and a second amplifier, the second amplifier having an input node and an output node, wherein at least one of the second capacitive device and the second resistance device is adjustable,
   wherein the input node of the first amplifier is connected to the output node of the second amplifier through the first capacitive device connected in series with the first amplifier and the output node of the first amplifier is connected to the input node of the second amplifier through the second capacitive device connected in series with the second amplifier,
   wherein the output node of the first differentiator has an output signal with an oscillating frequency that is adjustable by one or more of the adjustable resistance and capacitance devices of the first and the second differentiators and that is independent of the power supply to the first and second differentiators,
   wherein the first and second resistive devices each has a first node coupled to the input node of the first and second amplifiers, respectively, and
   wherein a second node of the resistive device of the first differentiator is coupled to the input node of the second differentiator and a second node of the resistive device of the second differentiator is coupled to the input node of the first differentiator.

2. The apparatus of claim 1, wherein at least one of the switchable device or the resistive device has a resistance controllable by a control signal.

3. The apparatus of claim 1, wherein the first and second amplifiers are inverters or operational amplifiers (OPAMP).

4. The apparatus claim 1, wherein the first capacitive device is a varactor with a capacitance controllable by a control signal.

5. The apparatus claim 4, wherein the second capacitive device is a varactor with a capacitance controllable by a control signal.

6. The apparatus of claim 1, further comprising a circuit for generating a control signal to adjust resistance of at least one of the resistive devices or capacitance of the first capacitive device and second capacitive device.

7. The apparatus of claim 1, wherein the first and second differentiators are coupled together for operating as an oscillator.

8. A system comprising:
   a wireless antenna;
   a processor operable to communicate with other devices via the wireless antenna, the processor comprising an oscillator including:
     a first differentiator including a first capacitive device, a first resistance device, and a first amplifier, the first amplifier having an output node and an input node, wherein at least one of the first capacitive device and the first resistance device is adjustable; and
     a second differentiator including a second capacitive device, a second resistance device, and a second amplifier, the second amplifier having an input node and an output node, wherein at least one of the second capacitive device and the second resistance device is adjustable,
     wherein the input node of the first amplifier is connected to the output node of the second amplifier through the first capacitive device connected in series with the first amplifier and the output node of the first amplifier is connected to the input node of the second amplifier through the second capacitive device connected in series with the second amplifier,
     wherein the output node of the first differentiator has an output signal with an oscillating frequency that is adjustable by one or more of the adjustable resistance and capacitance devices of the first and the second differentiators and that is independent of the power supply to the first and second differentiators,
     wherein the first and second resistive devices each has a first node coupled to the input node of the first and second amplifiers, respectively, and wherein a second node of the resistive device of the first differentiator is coupled to the input node of the second differentiator and a second node of the resistive device of the second differentiator is coupled to the input node of the first differentiator, and
   a display unit for displaying content processed by the processor.

9. The system of claim 8, wherein the first and second amplifiers are inverters.

10. An apparatus comprising:
    a first differentiator including a first capacitive device, a first resistance device, and a first amplifier, the first amplifier having an output node and an input node, wherein at least one of the first capacitive device and the first resistance device is adjustable; and
    a second differentiator including a second capacitive device, a second resistance device, and a second amplifier, the second amplifier having an input node and an output node, wherein at least one of the second capacitive device and the second resistance device is adjustable, wherein the input node of the first amplifier is connected to the output node of the second amplifier through the first capacitive device connected in series with the first amplifier and the output node of the first amplifier is connected to the input node of the second amplifier through the second capacitive device connected in series with the second amplifier, wherein the output node of the first differentiator has an output signal with an oscillating frequency that is adjustable by one or more of the adjustable resistance and capacitance devices of the first and the second differentiators and that is independent of the power supply to the first and second differentiators, wherein the first and second resistive devices each has a first node coupled to the input node of the first and second amplifiers, respectively, wherein a second node of the resistive device of the first differentiator is coupled to the input node of the second differentiator and a second node of the resistive device of the second differentiator is coupled to the input node of the first differentiator, and wherein the first and second differentiators comprise a switchable device coupled in series or parallel to the resistive device, the switchable device having a node coupled to the output node of the amplifier.

* * * * *